United States Patent
Solon

(10) Patent No.: US 8,971,046 B2
(45) Date of Patent: Mar. 3, 2015

(54) SOLAR PANEL JUNCTION BOX CAPABLE OF INTEGRATING WITH A VARIETY OF ACCESSORY MODULES, AND METHOD OF USE

(71) Applicant: Dean Solon, Gallatin, TN (US)

(72) Inventor: Dean Solon, Gallatin, TN (US)

(73) Assignee: Shoals Technologies Group, LLC, Portland, TN (US)

( * ) Notice: Subject to any disclaimer, the term of this patent is extended or adjusted under 35 U.S.C. 154(b) by 0 days.

(21) Appl. No.: 14/296,739

(22) Filed: Jun. 5, 2014

(65) Prior Publication Data

US 2014/0285975 A1    Sep. 25, 2014

Related U.S. Application Data

(62) Division of application No. 13/761,532, filed on Feb. 7, 2013.

(51) Int. Cl.
| | |
|---|---|
| H05K 7/00 | (2006.01) |
| H05K 7/10 | (2006.01) |
| H01R 13/46 | (2006.01) |
| H01R 13/514 | (2006.01) |
| H01L 31/048 | (2014.01) |
| H02G 3/08 | (2006.01) |
| H01R 31/02 | (2006.01) |

(52) U.S. Cl.
CPC .................. *H05K 7/10* (2013.01); *H01R 13/46* (2013.01); *H01R 13/514* (2013.01); *H01L 31/0485* (2013.01); *H02G 3/08* (2013.01); *H01R 31/02* (2013.01); *Y02E 10/50* (2013.01)
USPC ............................................. 361/728; 174/50

(58) Field of Classification Search
CPC .. H01L 31/0485; H01R 13/46; H01R 13/514; H01R 31/02; H02G 3/08; H05K 7/10; Y02E 10/50
USPC .............. 361/752, 728; 174/50, 50.64, 50.52, 174/17 R, 51
See application file for complete search history.

(56) References Cited

U.S. PATENT DOCUMENTS

| | | | |
|---|---|---|---|
| 3,258,522 | A | 6/1966 | Bartos et al. |
| 3,852,516 | A | 12/1974 | Vander Ploog et al. |
| 3,980,374 | A | 9/1976 | Fallot |
| 4,310,211 | A | 1/1982 | Bunnell et al. |
| 4,764,123 | A | 8/1988 | Shaw et al. |
| 4,849,580 | A | 7/1989 | Reuter |

(Continued)

OTHER PUBLICATIONS

Wind&Sun (Solar Electric Power Discussion Forum by Northern Arizona Wind & Sun) [online]. Flagstaff, AZ: "where to buy THWN-2 cable?" Oct.-Nov. 2006 [retrieved Aug. 6, 2010]. Retrieved from the Internet: <URL:http://www.wind-sun.com/ForumVB/archive/index.php?t-277.html> selected excerpts from Oct. 20, 2006, Nov. 6-7, 2006.

(Continued)

*Primary Examiner* — Yuriy Semenenko
(74) *Attorney, Agent, or Firm* — Carla Gannon Law

(57) ABSTRACT

A junction box is affixed to, and electrically coupled with, a solar panel. The junction box is configured to releaseably engage and disengage accessory modules, thereby allowing accessory modules to be replaced or exchanged easily. Accessory modules are electrically coupled with other accessory modules in the solar panel string. The furthest downstream accessory module is connected to a wire harness, which is connected to a central combiner box.

7 Claims, 10 Drawing Sheets

(56) References Cited

U.S. PATENT DOCUMENTS

| | | | |
|---|---|---|---|
| 4,870,878 A | 10/1989 | Butler et al. | |
| 5,099,088 A | 3/1992 | Usami et al. | |
| 5,226,838 A | 7/1993 | Hsu | |
| 5,358,588 A | 10/1994 | Tahara et al. | |
| 6,359,226 B1 | 3/2002 | Biddell et al. | |
| 7,201,596 B1 | 4/2007 | Bukovnik et al. | |
| 7,275,967 B1 | 10/2007 | Ollif | |
| 7,378,594 B2 | 5/2008 | Bigelow et al. | |
| 7,645,938 B2 | 1/2010 | Kogure et al. | |
| 8,172,938 B2 | 5/2012 | Alright et al. | |
| 2005/0068820 A1 | 3/2005 | Radosevich et al. | |
| 2005/0217888 A1 | 10/2005 | Arai et al. | |
| 2006/0049368 A1 | 3/2006 | Culbert | |
| 2008/0011347 A1 | 1/2008 | Aoyama et al. | |
| 2008/0289682 A1* | 11/2008 | Adriani et al. | 136/251 |
| 2009/0014055 A1 | 1/2009 | Beck et al. | |
| 2009/0098743 A1 | 4/2009 | Wadsworth | |
| 2009/0206666 A1 | 8/2009 | Sella et al. | |
| 2010/0078058 A1 | 4/2010 | Nightingale et al. | |
| 2010/0117453 A1 | 5/2010 | Langgood et al. | |
| 2010/0139733 A1* | 6/2010 | Jonczyk et al. | 136/244 |
| 2010/0326490 A1* | 12/2010 | Tagliareni et al. | 136/244 |
| 2011/0061705 A1* | 3/2011 | Croft et al. | 136/244 |
| 2012/0033392 A1 | 2/2012 | Golubovic et al. | |
| 2013/0026838 A1* | 1/2013 | Ma et al. | 307/71 |

OTHER PUBLICATIONS

PlastiDip Multi-Purpose Rubber Coating, Performix Handout regarding descriptions, specifications, alternative products, surface preparation, spraying, recommended equipment and settings, spraying, dipping, brushing, hints, additional application ideas, Technical Data Sheet #5, two pages, Revised Feb. 25, 2009. PlastiDip International, 3920 Pheasant Ridge Dr., Blaine, MN 55449, Phone 800-969-5432, Fax 763-785-2058, PLASTI DIP.com Material Safety Data Sheet, Performix Brand Handout, Various sections regarding manufacturer's name, hazardous ingredients information, physical and chemical characteristics, fire and explosion hazard data, optional hazard ratings identification, reactivity and stability data, health hazard data, medical conditions generally aggravated by exposure, precautions for safe handling and use, control measures, two pages. Date Material Safety Data Sheet (MSDS) was prepared May 25, 2007 (by Mark Kenow).

* cited by examiner

SOLAR PANEL JUNCTION BOX CAPABLE OF INTEGRATING WITH A VARIETY OF ACCESSORY MODULES, AND METHOD OF USE

CROSS-REFERENCE TO RELATED APPLICATION

This application is a divisional application of, and claims the benefit of, U.S. application Ser. No. 13/761,532, having a filing date of Feb. 7, 2013.

BACKGROUND (1) Field

The present invention relates generally to electrical control systems for use in the solar industry and, more particularly, to junction boxes that facilitate "plug and play" functionality of solar energy accessory modules.

(2) Related Art

The invention discussed herein can be used with connectors disclosed in U.S. patent application Ser. No. 12/502,395, pertaining to "Low Leakage Electrical Joints and Wire Harnesses, and Method of Making the Same", that was filed on Jul. 14, 2009, and issued on Dec. 10, 2013 as U.S. Pat. No. 8,604,342 B2, which is hereby incorporated by reference.

Due to technological advances, increased costs of non-renewable resources, and governmental incentives, solar energy can now be an economically advantageous endeavor. Accordingly, interest in solar energy has surged, and innovators are constantly developing new systems and components to optimize energy collection because variables such as inconsistent sunlight, breakage and malfunction outages in the solar field, and other fluctuations greatly affect the operating environment.

Considerable progress in optimization has been achieved by the development and refinement of various "accessory modules". In short, accessory modules are electrical components added onto conventional junction boxes to perform functions such as lessening peaks and valleys in energy generation, Maximum Power Point Tracking ("MPPT"), and to allow for direct AC conversion, including that achieved by micro-inverters. To achieve this, one junction box is outfitted with one accessory module, so the solar panels associated with that specific junction box are mediated by that specific accessory module.

While employing accessory modules is definitely an improvement over not using accessory modules, the one-module-per-group-of-panels arrangement does not permit optimization of the individual panels. This is undesirable because individual panels in a group may exist in different microenvironments. For example, one panel might be partially shaded while another panel is not. Accordingly, the optimization of individual panels would be most beneficial.

Optimizing individual panels, however, has been impractical or undesirable up until now. Specifically, coupling a panel to an accessory module requires affixing and hard wiring them together. As a result, when a panel or accessory module is damaged, destroyed, or otherwise quits working properly, the panel and accessory module are more-or-less permanently stuck together, and the entire assembly must be replaced. Alternatively, extensive time and labor is expended to separate the good hardware from the bad. Moreover, if it is desirable to swap out one accessory module for another (for example due to seasonal sunlight changes) one must swap the entire panel. This makes the optimization of individual panels impractical.

In view of the aforementioned limitations, it is desirable to have a device that allows an individual solar panel to be easily, expeditiously and reversibly outfitted with an accessory module.

Thus, there remains a need for a new and improved solar panel junction box capable of integrating with a variety of accessory modules, and the method of using this junction box.

SUMMARY OF THE INVENTIONS

The present invention is directed to a universal junction box that is affixed to a solar panel and replaces the conventional junction box and downstream accessory module box. The junction box is configured to releaseably engage and disengage accessory modules which employ a standard engagement interface, thereby facilitating the replacement of one accessory module for another, for whatever reason, without having to replace or move the associated panel.

The junction box is electrically connected to the associated solar panel by the panel's electrical ribbon. Individual panels in a string are connected to each other in series only through wire connectors of the accessory modules. The furthest downstream accessory module is connected to a wire harness, which is connected to a central combiner box.

One aspect of the present inventions is to provide a device that can be substantially permanently affixed to a solar panel.

Another aspect is that this device releaseably engages and disengages an accessory module, thereby allowing accessory modules to be replaced and changed with minimal effort, time, danger or damage.

Another aspect is that this device is compatible with pre-existing accessory module interfaces.

Another aspect is that this device provides functionality beyond a simple docking station, for example by acting as a junction box.

Another aspect is that this device is configured to quickly and easily interconnect with other panels in a string. Another aspect is that this device is compatible with preexisting connectors, plugs, implements and accessories.

Another aspect is that this device can be used for retrofitting existing panels, or can be coupled with newly manufactured panels.

Another aspect is that this device is safe, cost effective, electrically efficient and not labor or capital intensive to manufacture, deliver or install.

These and other aspects of the present inventions will become apparent to those skilled in the art after a reading of the following description of the preferred embodiment when considered with the drawings.

BRIEF DESCRIPTION OF THE DRAWING

FIG. 9 represents a bottom view of an accessory module schematically representing where an input could be plugged in;

DESCRIPTION OF THE PREFERRED EMBODIMENTS

Figure 1:
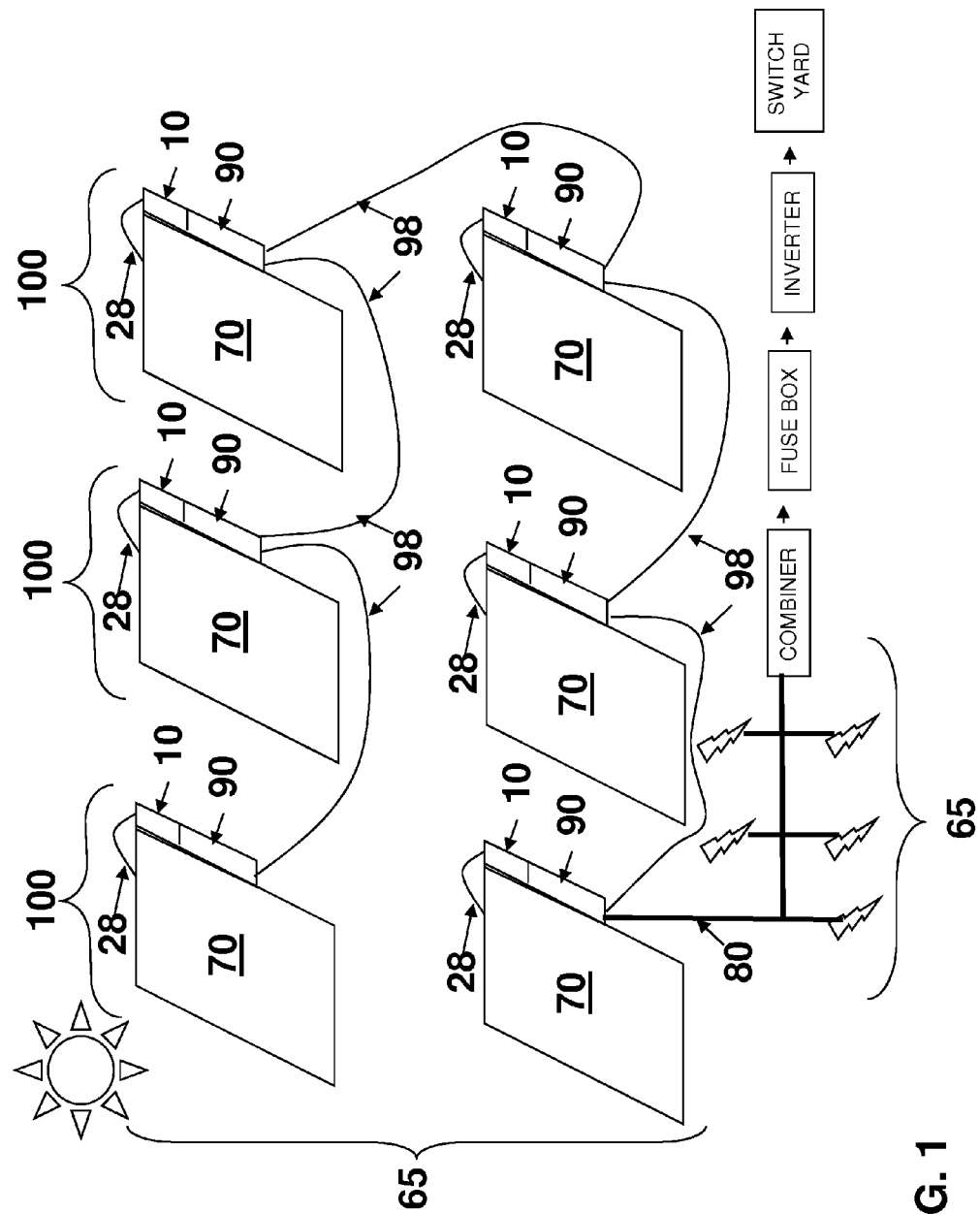
FIG. 1 schematically represents a string of solar panel control systems.

In the following description, like reference characters designate like or corresponding parts throughout the several views.

The following reference characters apply:
10—Junction box
13—Engagement platform
15—Base assembly
16—Air vent
17—Groove
18—Recess
19—Securing rib
20—Socket terminal assembly
22—Front surface
23—Back surface
27—Ribbon terminals
28—Ribbon
30—Removable lid
35—Diode cover
40—Female module plug
41—O-ring
42—Female Module terminal
45—Diode assembly module
46—Diode
60—Solar array
65—String
70—Solar panel
80—Wire harness
90—Accessory Module
92—Male module plug
94—Clipping assembly
95—Alignment ribs
96—Input
97—Output
98—Wire connector
99—Wire plug
100—Solar panel control system Referring now to the drawings, it will be understood that the illustrations describe a preferred embodiment of the invention, but are not intended to limit the inventions thereto.

An overview of solar array 60 is schematically depicted in FIG. 1, which preferably includes between 6 and 8 solar panels 70 in string 65, each solar panel 70 including one junction box 10, with each junction box 10 engaged to and in communication with one accessory module 90. The resulting assembly of accessory module 90/junction box/solar panel 70 is solar panel control system 100.

Each accessory module 90 is electrically connected to another accessory module 90. Solar panels 70 are those conventionally used in small- and industrial scale solar energy systems, with an example of a suitable panel being E237 from SunPower Corporation of San Jose, Calif.

The most downstream junction box 10 (bottom left) in string 65 is connected by wire harness 80 to "COMBINER". Wire harness 80 is preferably the device disclosed in U.S. patent application Ser. No. 12/502,395, filed on Jul. 14, 2009, issued on Dec. 10, 2013 as U.S. Pat. No. 8,604,342 B2, and which is incorporated herein. FIG. 1 depicts wire harness 80 accommodating 6 strings 65 (one string 65 plus 5 "bolts" representing other strings) but between 3 and 64 strings can be accommodated by wire harness 80. All strings 65 (and associated components such as solar panels 70) in one wire harness 80 collectively form solar array 60.

Downstream from COMBINER BOX is FUSE BOX, INVERTER and SWITCH YARD. As would be understood by one of ordinary skill, the combiner would actually accommodate multiple wire harnesses 80, the fuse box would actually accommodate multiple combiners, the inverter would actually accommodate multiple fuse boxes, and the switch yard would actually accommodate multiple inverters. However, redundant assemblies have been omitted for simplicity. The person of ordinary skill would also understand that the depiction merely represents some major components in one possible system.

Figure 4:
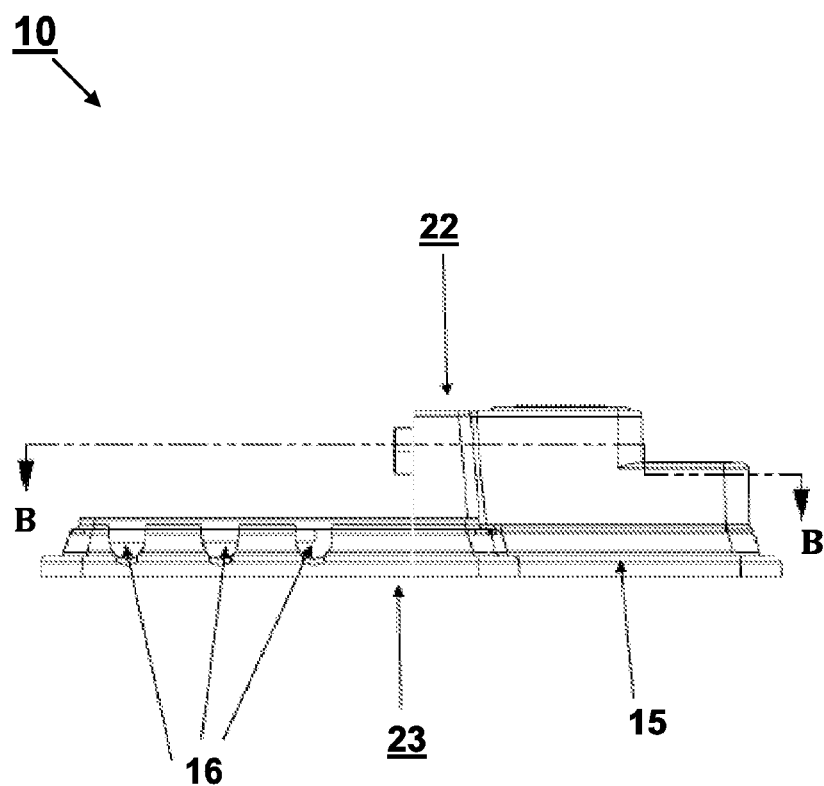
FIG. 4 is a side view of a junction box.

One junction box 10 is affixed to each solar panel 70, preferably by an adhesive such as PV 804 from Dow Corning of Midland, Mich., although other adhesives, or standard methods of attaching would be suitable. Back surface 23 (shown in FIG. 4) is adhered to solar panel 70. While FIG. 1 schematically depicts junction boxes 10 on the side of solar panels 70, it is possible to affix junction box 10 in other locations, preferably on solar panel 70 itself, so long as front surface 22 (FIG. 4) is accessible to permit engagement of accessory modules 90, and to permit connection of junction box 10 to solar panel 70 by ribbon 28. FIG. 1 depicts six solar panels 70 of string 65 in series, but it would also be possible to orient them in parallel.

Figure 2:
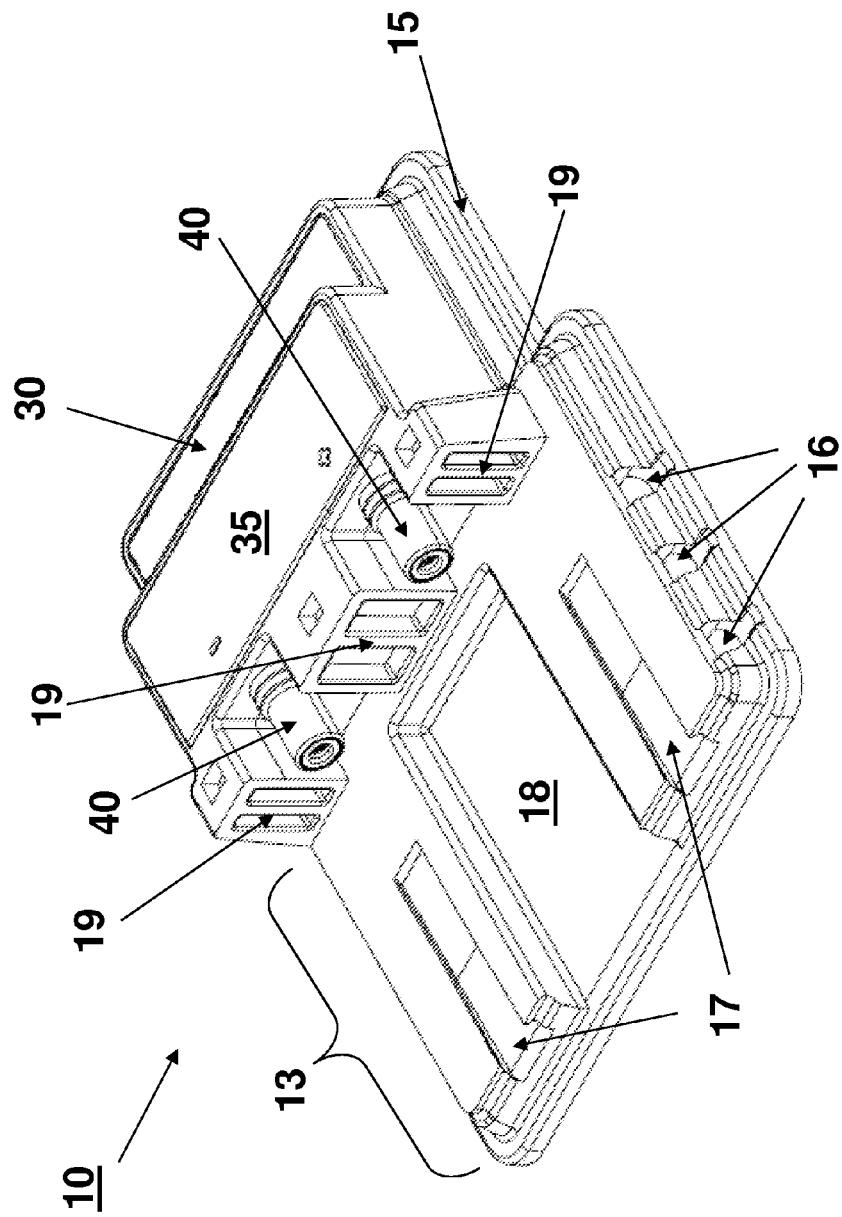
FIG. 2 is a perspective view of a junction box.

Referring now to FIG. 2, junction box 10 is constructed on base assembly 15 and can be conceptualized as having the electrical "brains" in the upper half, and the physical "module interface" in the lower half. Externally on the upper half is removable lid 30 which, as the name implies, is removable. Externally below removable lid 30 is diode cover 35, which is not removable. Removable lid 30 and diode cover 35 protect the electrical connections underneath, which are integral to base assembly 15. As used herein, "integral electrical connections" and like terms refer to the orientation of electrical components within base assembly 15 wherein base assembly 15 physically receives and secures the electrical components, versus providing a generic housing wherein electrical components and fasteners are assembled and secured therein.

More specifically, the integral electrical connections beneath removable lid 30 are ribbon terminals 27 (FIGS. 5 and 6) which attach to ribbons 28 of solar panel 70, as shown in FIG. 1. The ribbons in the solar panel are an electromechanical means of providing power from the solar cells to the junction box ribbon terminals. Ribbon terminals 27 provide the electrical path from panel 70 into junction box 10.

Figure 8:
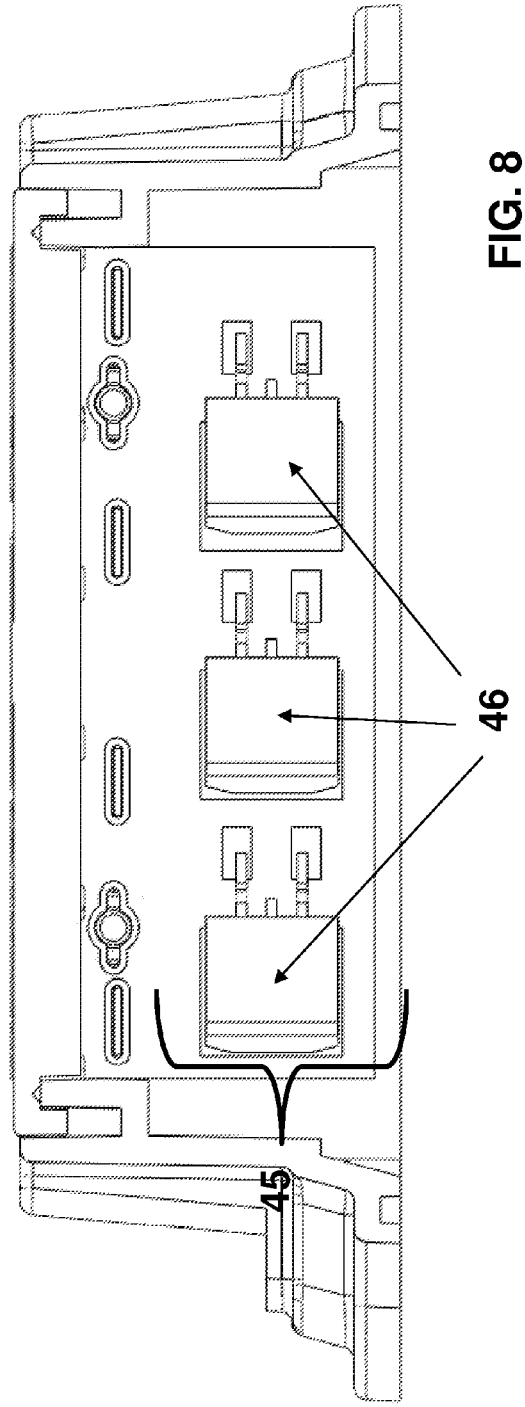
FIG. 8 is a cross-sectional side view of a junction box, taken along A-A of FIG. 3.

The integral electrical connections beneath diode cover 35 include diode printed circuit board assembly module 45 (FIGS. 5 and 8), including diodes 46 (FIG. 8). The function of diode assembly module 45 provides the electrical connection between ribbon terminals 27 and output terminal 20 while providing the bypass and reverse leakage functionality required to protect the solar panel.

Figure 3:
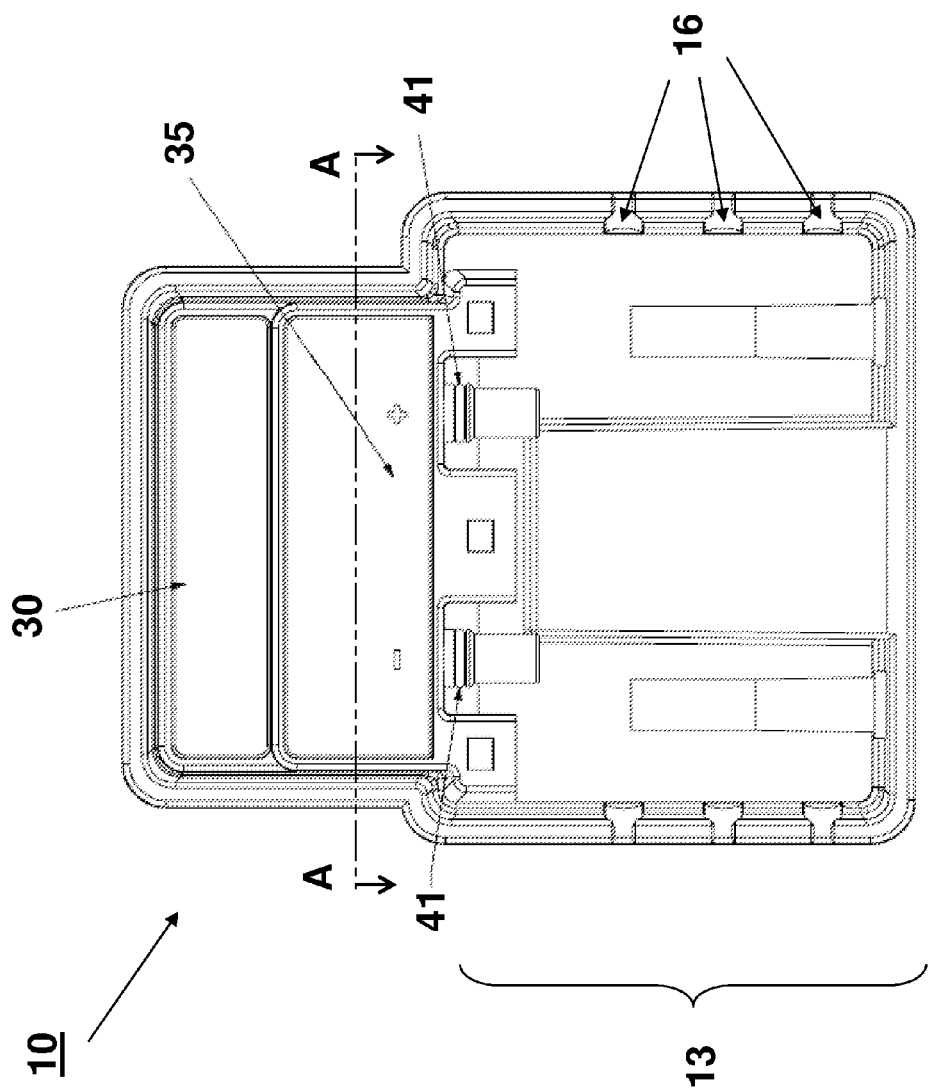
FIG. 3 is a plan view of a junction box.
Figure 5:
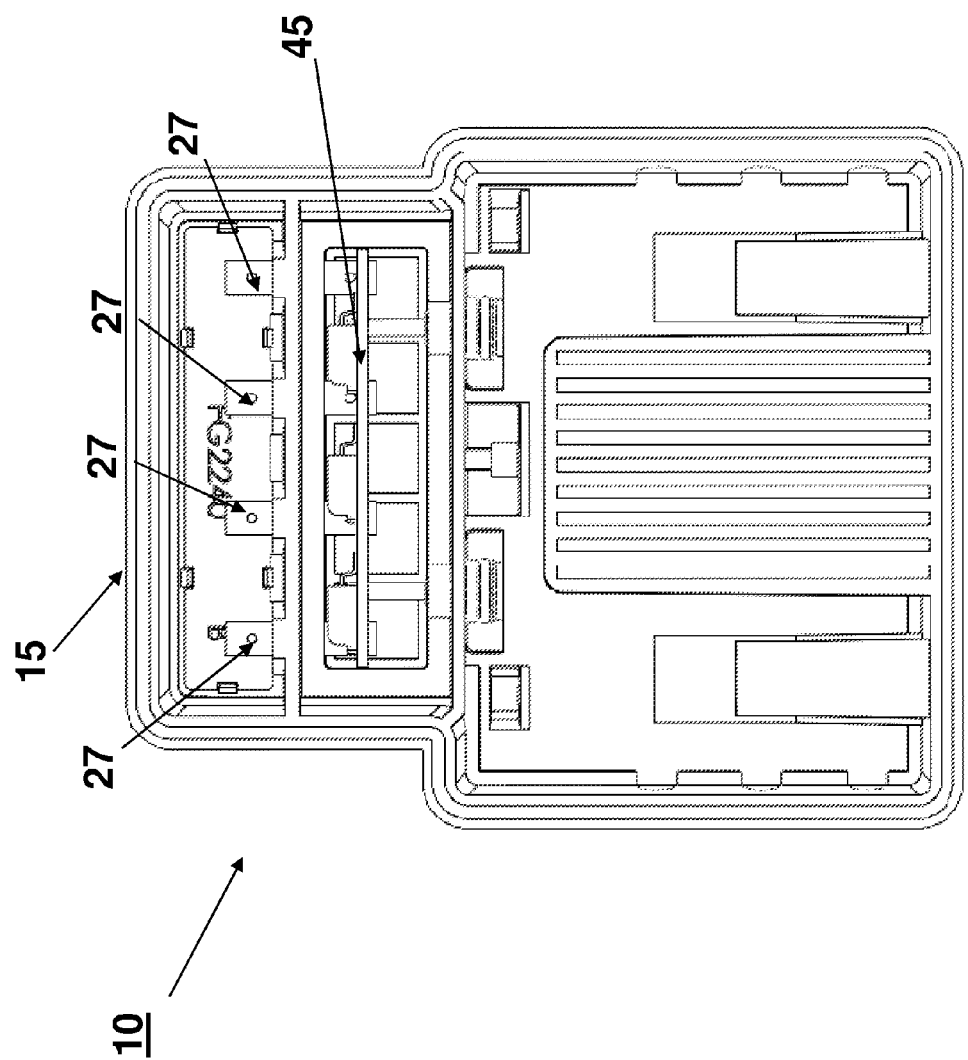
FIG. 5 is a plan view of a junction box with the lids removed to show structures beneath.
Figure 6:
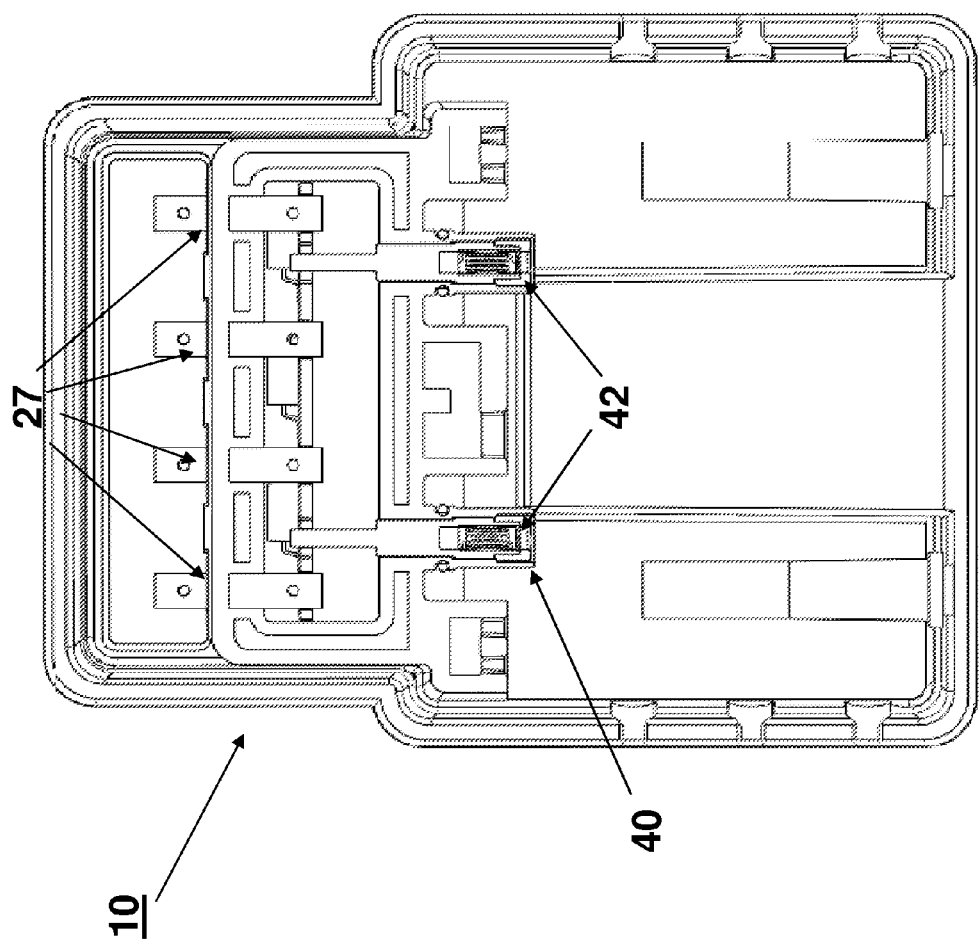
FIG. 6 is a cross-sectional plan view of a junction box, taken along B-B of FIG. 4.

As best shown in FIG. 5, socket assembly 20 is electrically connected to diode assembly module 45. Socket assembly 20 includes O-ring 41 (FIG. 3) and male module plug 40, neither of which are concealed by diode cover 35, as shown in FIGS. 2 and 3. As shown in cross section in FIG. 6, module terminal 42 is within male module plug 40 Male module plug 40 connects with female module plug 92 of accessory module 90, as shown in FIG. 10.

Figure 9:
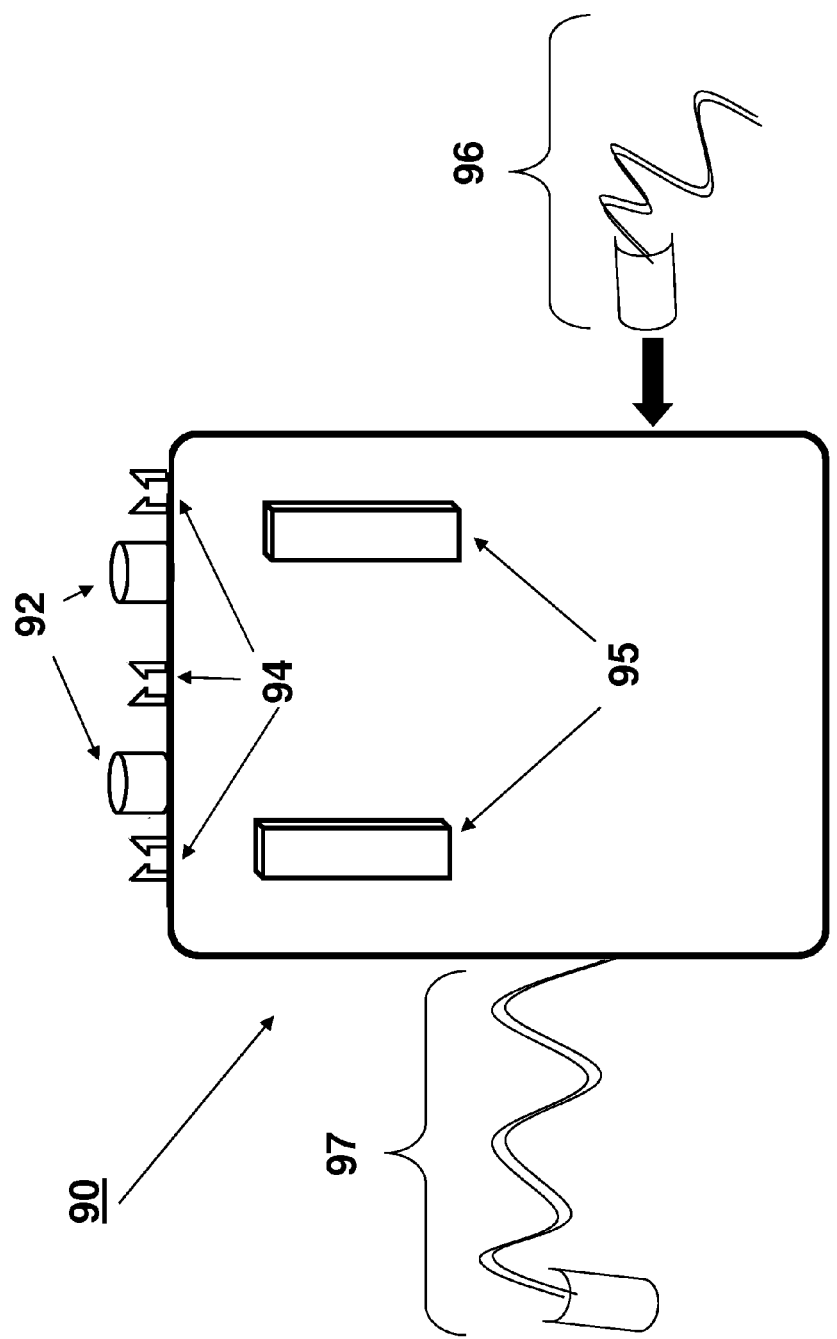

Accessory module 90 can be a variety of types used in the solar energy industry. An example of a power electronics type accessory module is a microinverter from Solantro Semiconductor of Ottawa, Ontario, Canada. An example of a supervisory or control type accessory module is an MPPT SPM1258A-S from Solar Power Technologies of Austin, Texas and/or a boost controller STG-MLM2-4 from Tigo Energy of Los Gatos, Calif. An example of a standard accessory module is STG-MLM-2 from Shoals Technologies Group of Portland, Tenn., which essentially acts as a place holder but does not perform an accessory module function. This invention contemplates using modules which are not yet designed or known, for example arc fault detection, as well as those in development and commercially available. However, in order to properly interface with junction box 10, accessory module 90 would have the universal orientation shown in FIGS. 9 and 10, including three clipping assemblies 94, and two female module plugs 92. This unique interface between the junction box and accessory module allows interchangeability of a limitless variety of modules.

Figure 7:
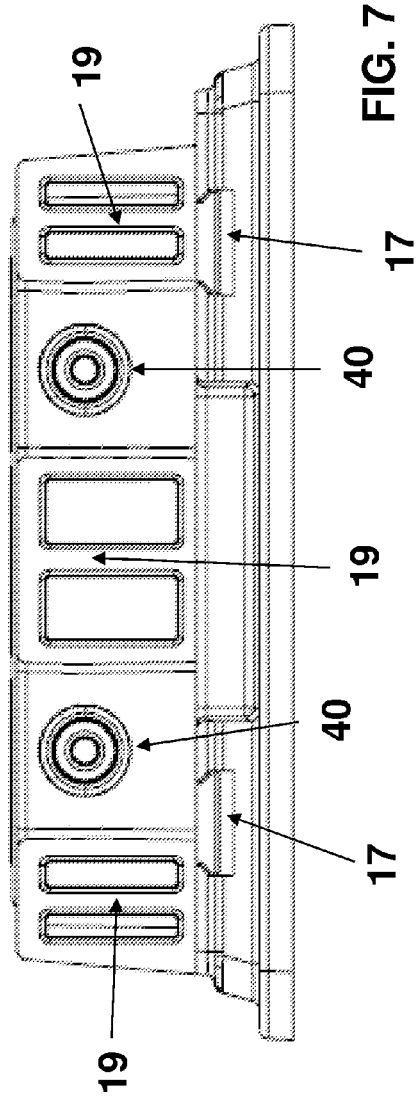
FIG. 7 is an end view of a junction box.
Figure 10:
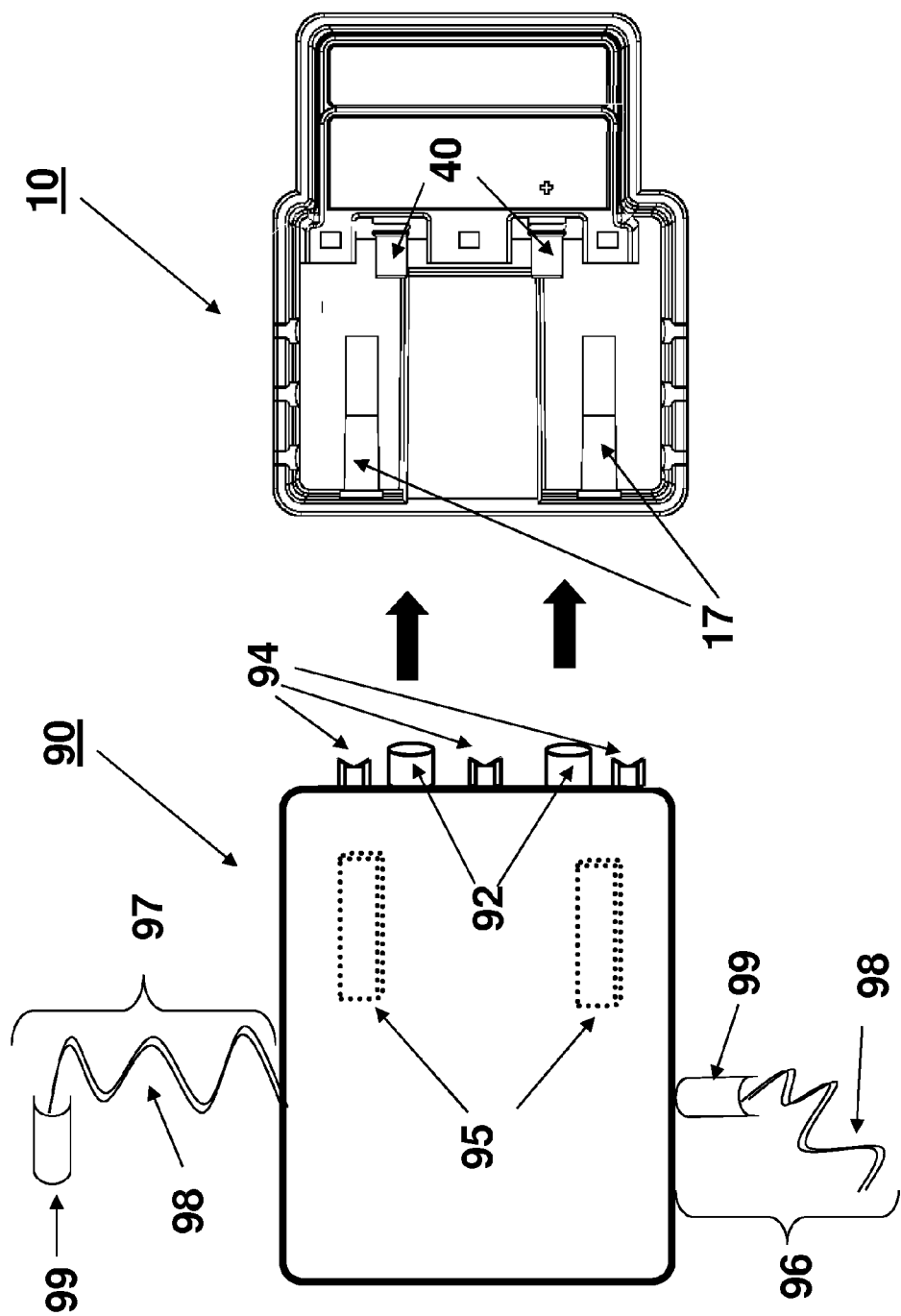
FIG. 10 schematically represents how an accessory module is engaged with a junction box, with the raised strips of the accessory module shown in phantom.

Returning to junction box 10 (FIGS. 2 and 7), on either side of each male module plug 40 is securing rib 19 which mates with clipping assembly 94 of module 90 (FIG. 9) when module 90 is slid into position on junction box 10, as shown best in FIG. 10. While clipping assembly 94 and securing rib 19 are preferred, other mechanisms for fastening module 90 into position on junction box 10 are also possible.

Figure 11:
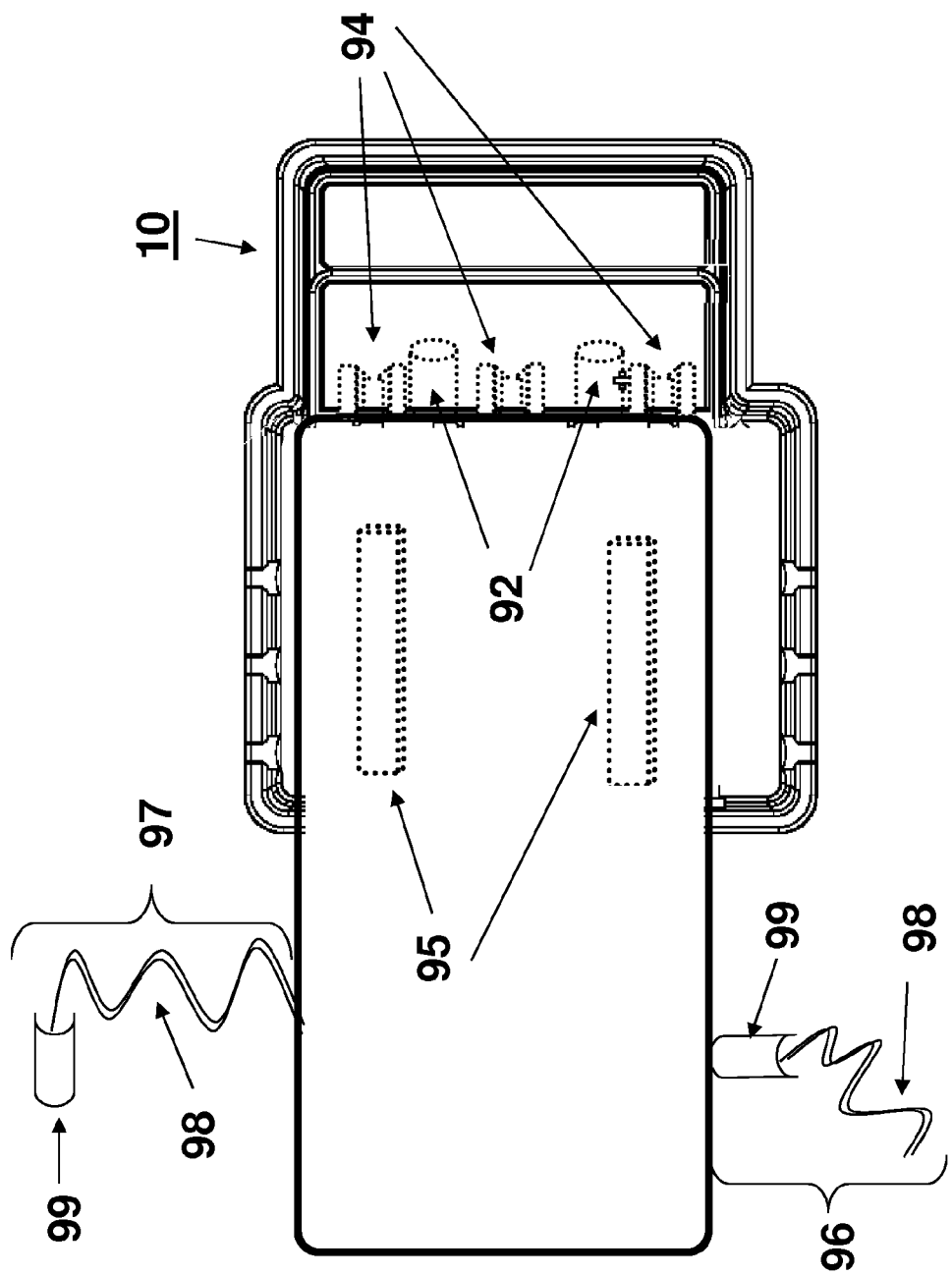
FIG. 11 schematically represents an accessory module engaged with a junction box, with certain accessory module structures shown in phantom.

Clipping assembly 94 and securing rib 19 assist in holding module 90 and junction box 10 together when engaged. In addition, other structures are involved with alignment and securing. As shown in FIG. 2, engagement platform 13 defines grooves 17 that receive corresponding alignment ribs 95 on module 90, shown in FIG. 9. As used herein, "engagement platform" shall refer to the general region of junction box 10 that includes grooves 17, recess 18, and surrounding (unnumbered) planar surface. In operation, a user aligns alignment ribs 95 of accessory module 90 with grooves 17 of junction box 10, and slides accessory module 90 until female module plug 92 engages with male module plug 40. The pre-engagement alignment is represented in FIG. 10 and engaged orientation is depicted in FIG. 11, with certain structures shown in phantom. Although not obvious from the drawings, grooves 17 are tapered going inward, thereby further securing junction box 10 and accessory module 90 together. It should be noted that junction box 10 and accessory module 90, when engaged, are releaseably engaged. As used herein "releaseably engaged" and similar terms refer to an engagement between parts wherein a user can apply reasonable physical force, with or without the necessary use of tools, to engage the parts, and reasonable physical force, with the use of tools, to disengage the parts, with such engagement and disengagement not likely to damage the parts, and with unintentional engagement and disengagement unlikely to occur in regular use. Recess 18 provides additional air circulation for engaged module 90 in order to reduce hot spots on the solar panel.

FIG. 11 shows an accessory module engaged with junction box 10. In this orientation, input 96, with wire connector 98 and wire plug 99, is shown on the bottom, and output 97, with wire connector 98 and wire plug 99, is shown on the top. However, it should be noted that accessory modules 90 come in a variety of different sizes, and have different functions, and the specific location of input 96 and output 97 is unimportant so long as it can properly interface with junction box 10. Preferably wire plug 99 will be at the distal (relative to accessory module 90) end of wire connector 98 for output 97, and proximal end of wire connector 98 for input 96. In this orientation the proximal end of wire connector 98 is "hard wired" into accessory module 90 for output 97. Alternatively, it is possible to employ wire plug 99 and wire connectors 98 at both ends of wire connector 96. Also, it is possible to employ a wire with a wire plug 99 or wire connector 98 and a bulkhead connector molded into the accessory module. Also, it is possible to have the input 96 and output 97 both be molded in connectors allowing the customer to control the wire length. Preferably wire plug 99 is MC4 from Multi-Contact of Windsor, Calif.

In use, one could either purchase solar panel 70 with junction box 10 already mounted, or retrofit existing solar panel 70 by affixing junction box 10. With junction box 10 in position, module 90 is engaged with engagement platform of junction box 10. The same is performed for other solar panels 70 in string 65. The specific modules 90 selected for each panel 70 depends on the particular circumstances. For example, a panel which is often in the shade might benefit from a boost controller, part number STG-MLM2-4, from Tigo Energy, while a panel that requires monitoring or switching capability might benefit from a MPPT accessory module, part number SPM1258A-S from Solar Power Technologies. Furthermore, a panel that requires AC output might benefit from a microinverter accessory module from Solantro Semiconductor. The resulting module type, or combination of module types, should be selected to optimize the overall productivity of the system with respect to energy generation, cost savings, safety, and so forth. Solar panels 70 are grouped into string 65 by connecting output 97 of a downstream accessory module 90 to input 96 of immediately upstream accessory module. Strings are connected at most downstream point to wire harness 80. All the strings connected to one wire harness 80 are collectively solar array 60.

Accessory modules 90 are interchangeable by disengaging accessory module 90 from junction box 10 (which is affixed to solar panel 70), and engaging a different accessory module. As used herein "interchangeable solar panel control system" refers to solar panel control system 100 with this functionality.

Certain modifications and improvements will occur to those skilled in the art upon a reading of the foregoing description. By way of example, if one accessory module would suffice for all panels in a string, all panels except one could employ "standard accessory modules". It should be understood that all such modifications and improvements have been deleted herein for the sake of conciseness and readability but are properly within the scope of the following claims.

I claim:

1. A first interchangeable solar panel control system, said system comprising:
   a solar panel;
   a junction box including an engagement platform having at least one groove and at least one securing rib, said junction box affixed to said solar panel; and
   an accessory module releaseably engaged with said engagement platform, said accessory module slidably engaged with said at least one groove and fixed to said at least one securing rib.

2. The first control system of claim 1 wherein said accessory module includes an industry standard interface.

3. The first control system of claim 2 wherein said industry standard interface includes two female module plugs, three clipping assemblies and two raised strips.

4. The first control system of claim 1 wherein said junction box is affixed to said solar panel by an adhesive.

5. The first control system of claim 1 wherein said accessory module further comprises a first input and a first output.

6. The first control system of claim 5 further comprising a second control system having a second input and a second output, said second control system downstream from said first control system, wherein the first output is connected to the second input.

7. The first control system of claim 6 further comprising a third control system having a third input and a third output, said third control system downstream from said second control system, wherein the second output is connected to the third input.

* * * * *